(12) United States Patent
Muller-Fischer et al.

(10) Patent No.: US 9,785,729 B2
(45) Date of Patent: Oct. 10, 2017

(54) TECHNIQUE FOR SIMULATING THE DYNAMICS OF HAIR

(71) Applicant: NVIDIA CORPORATION, Santa Clara, CA (US)

(72) Inventors: Matthias Muller-Fischer, Uerikon (CH); Nuttapong Chentanez, Bangkok (TH); Tae-Yong Kim, Los Angeles, CA (US)

(73) Assignee: NVIDIA Corporation, Santa Clara, CA (US)

( * ) Notice: Subject to any disclaimer, the term of this patent is extended or adjusted under 35 U.S.C. 154(b) by 688 days.

(21) Appl. No.: 13/714,859

(22) Filed: Dec. 14, 2012

(65) Prior Publication Data
US 2014/0172380 A1    Jun. 19, 2014

(51) Int. Cl.
G06F 7/60    (2006.01)
G06G 7/48    (2006.01)
G06F 17/50    (2006.01)
G06T 13/40    (2011.01)

(52) U.S. Cl.
CPC ...... *G06F 17/5009* (2013.01); *G06F 17/5018* (2013.01); *G06T 13/40* (2013.01)

(58) Field of Classification Search
CPC .. G06T 13/40; G06F 17/5009; G06F 17/5018
USPC .......................................................... 703/2, 6
See application file for complete search history.

(56) References Cited

U.S. PATENT DOCUMENTS

2005/0075557 A1* 4/2005 Kamiyama ............... 600/407
2009/0091575 A1* 4/2009 Borac .................. G06T 13/40
                                                        345/474
2014/0147013 A1* 5/2014 Shandas ................ A61B 8/481
                                                        382/107

FOREIGN PATENT DOCUMENTS

TW              1226022 B         1/2005

OTHER PUBLICATIONS

Sunil Hadap, Oriented strands-dynamics of stiff multi-body system, 2006, Eurographics/ACM SIGGRAPH Symposium on Computer Animation, pp. 91-100.*
Bando et al., Animating Hair With Loosely Connected Particles, 2003, EUROGRAPHICS 2003, vol. 22, No. 3, pp. 411-418.*
Guan et al., Multi-linear Data-Driven Dynamic Hair Model with Efficient Hair-Body Collision Handling, Jul. 29, 2012, ACM SIG-GRAPH/Eurographics Symposium on Computer Animation (SCA), pp. 295-304.*
Eduardo Poyart and Petros Faloutsos, Real-Time Hair Simulation with Segment-Based Head Collision, 2010, MIG 2010, LNCS 6459, pp. 386-397.*
Selle et al., "A mass spring model for hair simulation", 2008, ACM Transactions on Graphics (TOG). vol. 27. No. 3. ACM, pp. 1-11.*

(Continued)

*Primary Examiner* — Juan Ochoa
(74) *Attorney, Agent, or Firm* — Artegis Law Group, LLP

(57) ABSTRACT

A simulation engine is configured to generate a physical simulation of a chain of particles by implementing a physics-based algorithm. The simulation engine is configured to generate a predicted position for each particle and to then adjust the predicted position of each particle based on a set of constraints associated with the physics-based algorithm. The simulation engine may then generate a predicted velocity for a given particle based on the adjusted, predicted position of that particle and based on the adjusted, predicted position of an adjacent particle.

22 Claims, 6 Drawing Sheets

(56) References Cited

OTHER PUBLICATIONS

Petrovic et al., "Volumetric methods for simulation and rendering of hair", 2005, Pixar Animation Studios, pp. 1-6.*
Kelly Ward, et al. "A survey on hair modeling: Styling, simulation, and rendering", 2007, IEEE Transactions on Visualization and Computer Graphics 13.2, pp. 1-21.*
Yvonne Jung et al., "Believable virtual characters in human-computer dialogs", 2011, Eurographics State of the Art Reports 2, pp. 75-100.*
Roy Featherstone, Robot dynamics algorithms, 1984, Diss. University of Edinburgh, pp. 1-211.*
Hadap et al., "Modeling Dynamic Hair as a Continuum", 2001, Computer Graphics Forum, vol. 20, No. 3, Blackwell Publishers Ltd., pp. 1-10.*
Pyarelal Knowles, "GPGPU based particle system simulation", 2009, School of Computer Science and Information Technology RMIT University Melbourne, Australia 12.04, pp. 1-33.*
Mailer et al., Position based dynamics, Apr. 2007, Journal of Visual Communication and Image Representation, vol. 18, Issue 2, ISSN 1047-3203, pp. 109-118.*
Müller et al., "Solid simulation with oriented particles", 2011, ACM transactions on graphics (TOG), vol. 30, No. 4, ACM, pp. 1-10.*
Brown et al., "Real-time knot-tying simulation", 2004, The Visual Computer 20.2, pp. 1-8.*
Zhang et al., "Simulation guided hair dynamics modeling from video", 2012, Computer Graphics Forum. vol. 31. No. 7. Blackwell Publishing Ltd., pp. 1-8.*
Raveendran et al., "Hybrid smoothed particle hydrodynamics", 2011, Proceedings ACM SIGGRAPH/Eurographics symposium on computer animation, pp. 1-10.*
Chang et al., "A practical model for hair mutual interactions", 2002, Proceedings of the ACM SIGGRAPH/Eurographics symposium on Computer animation, pp. 1-9.*
Müller, M. et al.: Fast Simulation of Inextensible Hair and Fur. In: Proceedings of the Workshop on Virtual Reality Interaction and Physical Simulation, VRIPHYS 2012, Eurographics Association, ed. By J. Bender, A. Kuijper, D.W. Fellner and E. Guerin, der Öffentlichkeit zugänglich zumindest ab dem Dec. 6, 2012.
Rungjiratananon, W. et al.: Chain Shape Matching for Simulating Complex Hairstyles. Autorenmanuskrip eines Computer Graphics Forum-Artikels aus dem Jahr 2010, S. 1-9, im Internet verfügbar unter der URL http://kanamori.cs.tsukuba.ac.up/publications/cgf10/WitwatCGF.pdf, [recherchiert am Nov. 14, 2014].
Nealen, A. et al.: Physically Based Deformable Models in Computer Graphics. Eurographics State of the Art Report, 2005, S. 1-24, im Internet verfügbar unter der URL http://cgvr.cs.uni-bremen.de/teaching/vr_literatur/, [recherchiert am Nov. 14, 2014].

* cited by examiner

TECHNIQUE FOR SIMULATING THE DYNAMICS OF HAIR

BACKGROUND OF THE INVENTION

Field of the Invention

The present invention generally relates to physical simulations and, more specifically, to a technique for simulating the dynamics of hair.

Description of the Related Art

Conventional simulation engines are capable of simulating the dynamics of of a wide variety of physical objects, including polygons, particles, and hair. In order to simulate the dynamics of hair, a conventional simulation engine typically models each strand of hair as a chain of particles. The simulation engine may apply a physics-based algorithm to each particle in a chain of particles in order to update the position of each such particle at a given time step in the simulation. The physics-based algorithm may incorporate various laws of motion, as well as different physical constraints, when updating the positions of particles in the chain of particles.

When simulating hair via the approach described above, the simulation engine typically imposes a distance constraint between particles in the chain of particles in order to ensure that neighboring particles reside a fixed distance from one another. Enforcing distance constraints in this fashion may cause the chain of particles to appear inextensible and therefore more similar to a natural strand of hair.

However, enforcing multiple different sets of constraints can be difficult because updating the position of one particle to meet one set of constraints may end up causing the position of that particle to violate a different set of constraints. Conventional simulation engines work around this problem by iteratively adjusting the position of each particle many times during a given time step until all constraints are met.

The problem with this approach is that applying a physics-based algorithm and associated physical constraints iteratively at every time step of the simulation for every particle in the simulation in order to prevent the hair from appearing stretchy is often computationally intensive, and may result in a very slow physics simulation. Reducing the number of iterations per time step can speed up the simulation but this results in unrealistic looking stretchy hair. Consequently, the simulation of inextensible hair could not be implemented within a real-time physics simulation such as a video game.

Accordingly, what is needed in the art is a more efficient technique for simulating hair in real-time.

SUMMARY OF THE INVENTION

One embodiment of the present invention sets forth a computer-implemented method for generating a physical simulation of a chain of particles, including generating a position prediction for a particle in the chain of particles based on a set of physical rules associated with the physical simulation, generating an adjusted position prediction for the particle based on the position prediction and a set of physical constraints associated with the chain of particles, generating a velocity prediction for the particle based on a first velocity prediction factor associated with the particle and based on a second velocity prediction factor associated with a first neighbor particle residing adjacent to the particle in the chain of particles, updating a current position of the particle on a display device to reflect the adjusted position prediction associated with the particle, and updating a current velocity of the particle to reflect the velocity prediction associated with the particle.

One advantage of the disclosed algorithm is that the position of each particle within the physical simulation may only need to be updated with just one iteration of the algorithm to satisfy constraints associated with each such particle. Accordingly, chains of particles may appear to have zero stretching. The disclosed algorithm may thus be implemented in real-time simulations such as video games.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
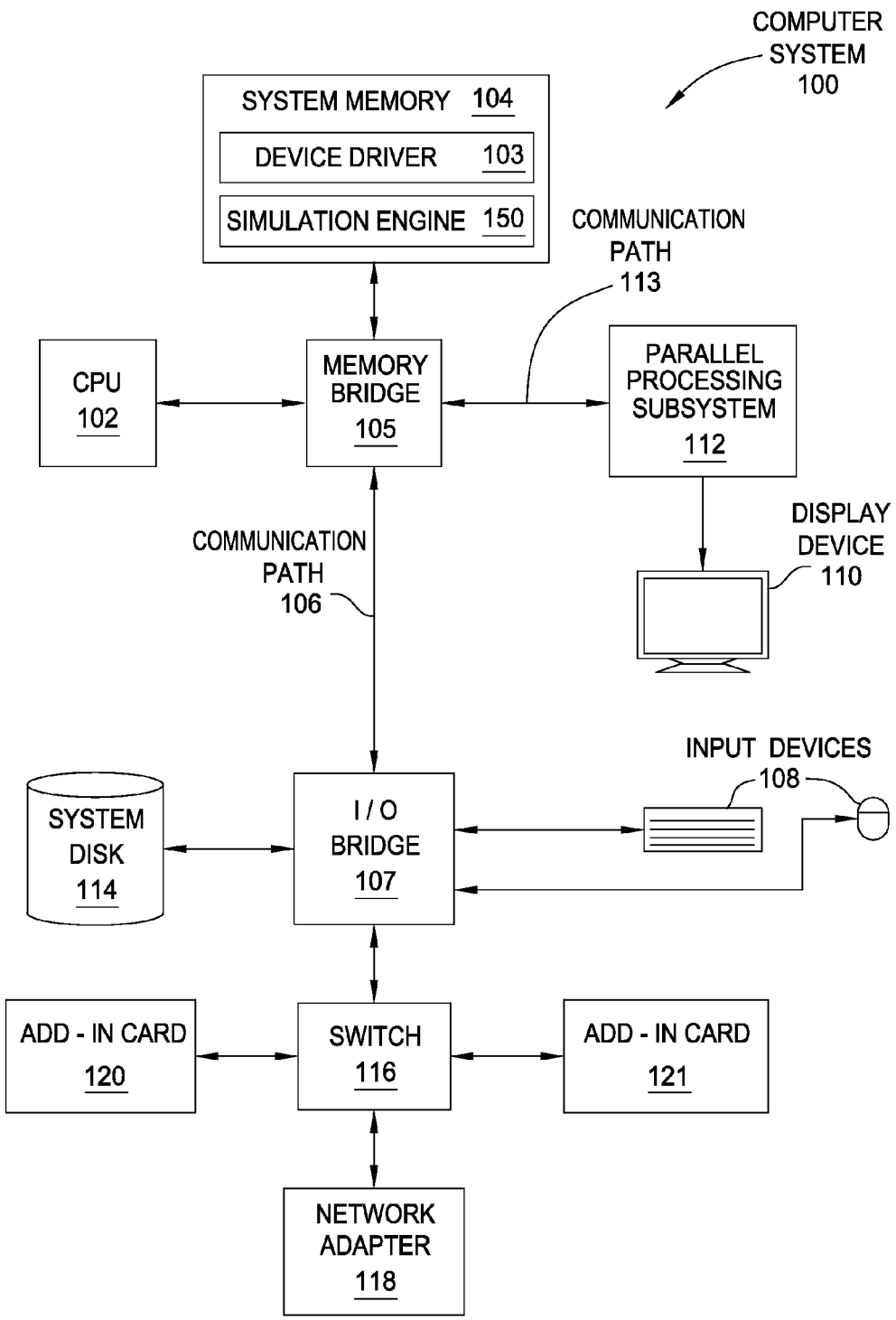
FIG. 1 is a block diagram illustrating a computer system configured to implement one or more aspects of the present invention.

FIG. 1 is a block diagram illustrating a computer system 100 configured to implement one or more aspects of the present invention. Computer system 100 includes a central processing unit (CPU) 102 and a system memory 104 communicating via an interconnection path that may include a memory bridge 105. Memory bridge 105, which may be, e.g., a Northbridge chip, is connected via a bus or other communication path 106 (e.g., a HyperTransport link) to an input/output (I/O) bridge 107. I/O bridge 107, which may be, e.g., a Southbridge chip, receives user input from one or more user input devices 108 (e.g., keyboard, mouse) and forwards the input to CPU 102 via communication path 106 and memory bridge 105. A parallel processing subsystem 112 is coupled to memory bridge 105 via a bus or second communication path 113 (e.g., a Peripheral Component Interconnect (PCI) Express, Accelerated Graphics Port (AGP), or HyperTransport link); in one embodiment parallel processing subsystem 112 is a graphics subsystem that delivers pixels to a display device 110 that may be any conventional cathode ray tube, liquid crystal display, light-emitting diode display, or the like. A system disk 114 is also connected to I/O bridge 107 and may be configured to store content and applications and data for use by CPU 102 and parallel processing subsystem 112. System disk 114 provides non-volatile storage for applications and data and may include fixed or removable hard disk drives, flash memory devices, and compact disc (CD) read-only-memory (ROM), digital versatile disc (DVD) ROM, Blu-ray, high-definition (HD) DVD, or other magnetic, optical, or solid state storage devices.

A switch 116 provides connections between I/O bridge 107 and other components such as a network adapter 118 and various add-in cards 120 and 121. Other components (not explicitly shown), including universal serial bus (USB) or other port connections, CD drives, DVD drives, film recording devices, and the like, may also be connected to I/O bridge 107. The various communication paths shown in FIG. 1, including the specifically named communication paths 106 and 113 may be implemented using any suitable protocols, such as PCI Express (PCI-e), AGP, HyperTransport, or any other bus or point-to-point communication protocol(s), and connections between different devices may use different protocols as is known in the art.

In one embodiment, the parallel processing subsystem 112 incorporates circuitry optimized for graphics and video processing, including, for example, video output circuitry, and constitutes a graphics processing unit (GPU). In another embodiment, the parallel processing subsystem 112 incorporates circuitry optimized for general purpose processing, while preserving the underlying computational architecture, described in greater detail herein. In yet another embodiment, the parallel processing subsystem 112 may be integrated with one or more other system elements in a single subsystem, such as joining the memory bridge 105, CPU 102, and I/O bridge 107 to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For instance, in some embodiments, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other embodiments, I/O bridge 107 and memory bridge 105 might be integrated into a single chip instead of existing as one or more discrete devices. Large embodiments may include two or more CPUs 102 and two or more parallel processing subsystems 112. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

Parallel processing subsystem 112 includes one or more parallel processing units (PPUs) each configured to perform multiple processing operations simultaneously. In one embodiment, each PPU within parallel processing subsystem 112 is a graphics processing unit (GPU) or a general-purpose GPU. A given PPU may include any amount of local memory and may also be coupled to a global memory also accessible by any of the other PPUs within parallel processing subsystem 112. Each PPU may include any number of different processing cores, each such core capable of executing multiple different execution threads simultaneously. A given execution thread may perform graphics-related operations or generic processing operations.

Each PPU within parallel processing subsystem 112 may also execute a simulation application 150 that resides in system memory 103. When executing simulation application 150, a given PPU is configured to generate a physical simulation of one or more chains of particles and to output pixels that represent that physical simulation to a display device. A given chain of particles within the physical simulation could represent, for example, a strand of hair or fur. In one embodiment, simulation engine 150 may reside within a video game that executes on both CPU 102 and parallel processing subsystem 112, and each chain of particles simulated by a PPU within parallel processing subsystem 112 may represent a strand of hair or fur attached to a character within that video game.

At each time step in the physical simulation, simulation engine 150 is configured to update the position and velocity of each particle in a chain of particles within the physical simulation by implementing a physics-based algorithm described below in conjunction with FIG. 2.

Simulating the Dynamics of Hair

Figure 2:
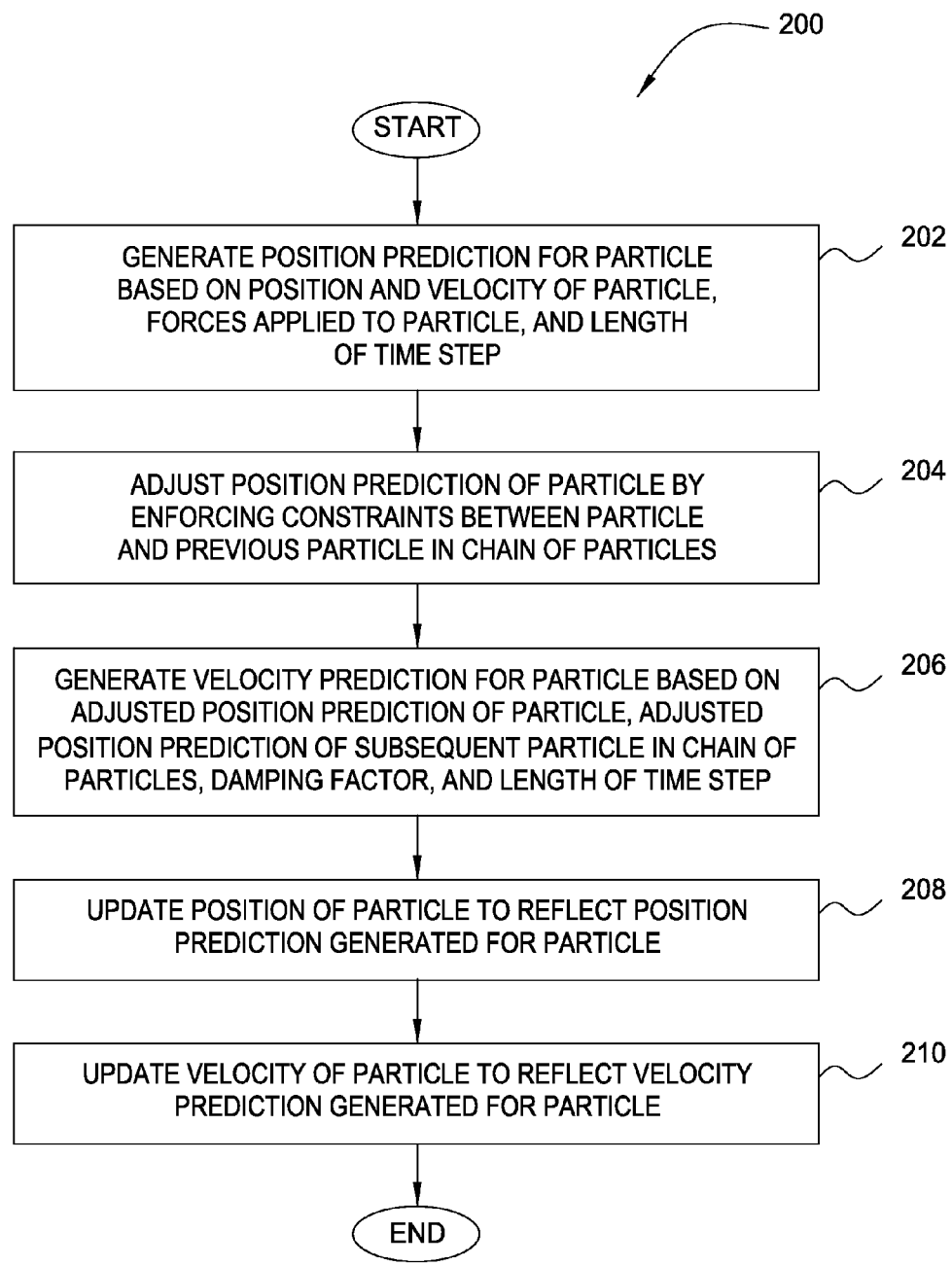
FIG. 2 is a flow diagram of method steps for simulating a chain of modeled particles, according to one embodiment of the present invention.

FIG. 2 is a flow diagram of method steps for simulating a chain of particles, according to one embodiment of the present invention. Although the method steps are described in conjunction with the system of FIG. 1, persons of ordinary skill in the art will understand that any system configured to perform the method steps, in any order, is within the scope of the inventions. The method steps described below represent the physics-based algorithm implemented by simulation engine 150, as mentioned above in conjunction with FIG. 1.

As shown, a method 200 begins at step 202, where simulation engine 150 generates a position prediction for a particle in a chain of particles. Simulation engine 150 is configured to generate the position prediction for the particle based on the current position and velocity of the particle at the current time step, a set of forces applied to the particle at the current time step, as well as the length of the time step implemented by simulation engine 150 for the physical simulation. Simulation engine 150 may perform step 202 by applying a set of physical rules to the particle that represent a physical law of motion, such as, e.g., Newton's second law of motion and a time integration scheme such as, e.g., the explicit Euler method. In one embodiment, the chain of particles is attached to another object within the physical simulation by an "anchor" particle residing at one end of the chain of particles. The object to which the chain is attached could be, e.g., a character within a video game configured to implement simulation engine 150.

At step 204, simulation engine 150 adjusts the position prediction of the particle by enforcing a set of constraints between the particle and a "previous" particle in the chain of particles. As referred to herein, a "previous" particle is a particle residing adjacent to the particle towards the anchor particle. In one embodiment, simulation engine 150 adjusts the position prediction of the particle by "moving" that particle towards the previous particle along a line that connects the particle to the previous particle. In this fashion, simulation engine 150 could "move" the particle until the distance constraint is met.

At step 206, simulation engine 150 generates a velocity prediction for the particle based on the adjusted position prediction generated at step 204, the adjusted position prediction of a "subsequent" particle in the chain of particles, a damping factor, and the length of the time step implemented by simulation engine 150 for the physical simulation. As referred to herein, a "subsequent" particle is a particle residing adjacent to the particle opposite the anchor particle. Simulation engine 150 may generate the adjusted position prediction of the subsequent particle in the chain of particles by performing steps 202 and 204 of the method 200 with the subsequent particle.

At step 208, simulation engine 150 updates the position of the particle to reflect the position prediction generated for the particle at step 202. At step 210, simulation engine 150 updates the velocity of the particle to reflect the velocity prediction generated for the particle at step 206. The method 200 then ends.

Simulation engine 150 may implement the method 200 for each particle in a chain of particles in parallel, e.g. on each processing core of a PPU within parallel processing subsystem 112, thereby performing each step of the method 200 for each particle simultaneously. With this approach, the adjusted position predictions for particles could be made available to simulation engine 150 when computing the velocity predictions of neighboring particles. In general, simulation engine 150 need only implement the method 200 once for each particle during a given time step, thereby conferring a significant advantage over conventional techniques that require multiple iterations of physics-based algorithms in order to update the positions of particles.

The approach described above is discussed in greater detail by way of example in conjunction with FIGS. 3A-3D.

Figure 3A:
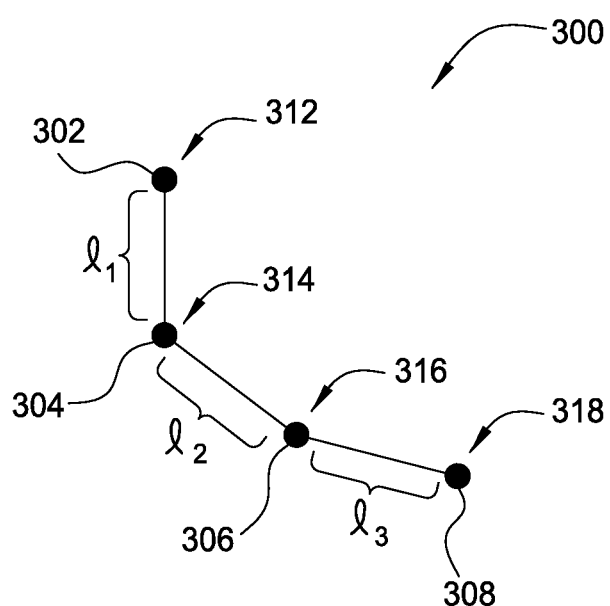
FIGS. 3A-3D are conceptual diagrams that represent a chain of modeled particles, according to various embodiments of the present invention.

FIG. 3A is a conceptual diagram that represents a chain 300 of modeled particles, according to one embodiment of the present invention. As shown, chain 300 includes particles 302, 304, 306, and 308 that reside at positions 312, 314, 316, and 318, respectively. Particle 302 could be the "anchor" particle, as described above in conjunction with FIG. 2, and as such, may have a fixed position relative to an object within the physical simulation.

At each time step of the physical simulation, simulation engine 150 computes a position prediction for a given particle based on the position, velocity, and forces applied to that particle during a previous time step, in like fashion as described in conjunction with step 202 of the method 200 shown in FIG. 2. In FIG. 3A, particles 302, 304, 306, and 308 are disposed at position prediction 312, 314, 316, and 318, respectively, according to the position prediction generated for each of those particles by simulation engine 150. As also shown, particles 302 and 304 reside at a distance L1 from one another, particles 304 and 306 reside at a distance L2 from one another, and particles 306 and 308 reside at a distance L3 from one another. Simulation engine 150 is configured to adjust the position prediction for each particle in order to meet a set of physical constraints, as discussed in greater detail below in conjunction with FIG. 3B.

Figure 3B:
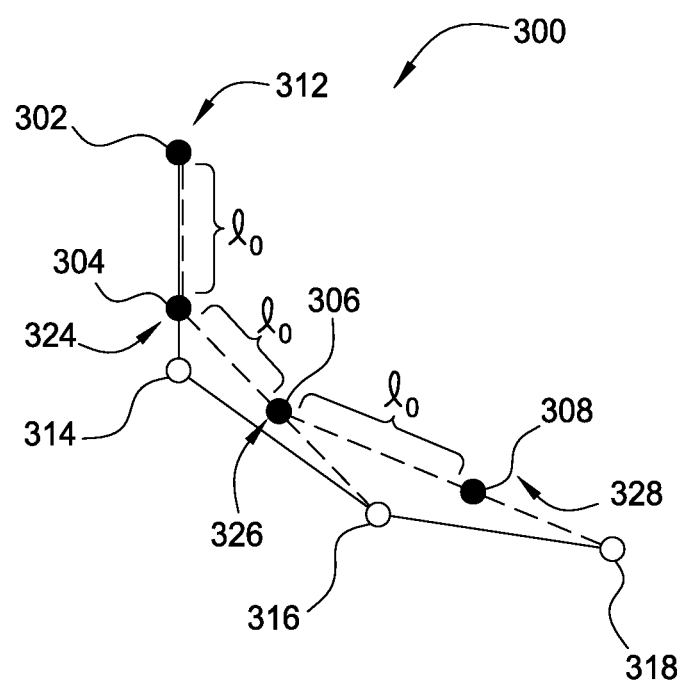

FIG. 3B is a conceptual diagram that represents the chain 300 of modeled particles, according to one embodiment of the present invention. As shown, particle 304 now resides at position 324, particle 306 now resides at position 326, and particle 308 now resides at position 328. Furthermore, particle 304 now resides at a distance L0 from particle 302, particle 306 now resides at the same distance L0 from particle 304, and particle 308 also resides at that distance L0 from particle 306. As mentioned above in conjunction with FIG. 3A, simulation engine is configured to adjust the position predictions for each particle to meet a set of physical constraints. In FIG. 3B, simulation engine 150 has adjusted the position predictions shown in FIG. 3A to meet the physical constraint that each of particles 302, 304, 306, and 308 reside at a fixed distance L0 from one another, similar to step 204 of the method 200 described above in conjunction with FIG. 2.

In one embodiment, simulation engine 150 processes constraints associated with the chain 300 of particles in a "top-down" fashion starting with the anchor particle. A given particle is moved on a straight line towards a previous particle in order to satisfy a distance constraint between the particle and the previous particle. This process is performed for each particle in succession, starting from the anchor particle, so that each distance constraint associated with the chain 300 of particles may be satisfied. Simulation engine 150 may then generate a velocity prediction for each particle, as described in greater detail below in conjunction with FIG. 3C.

Figure 3C:
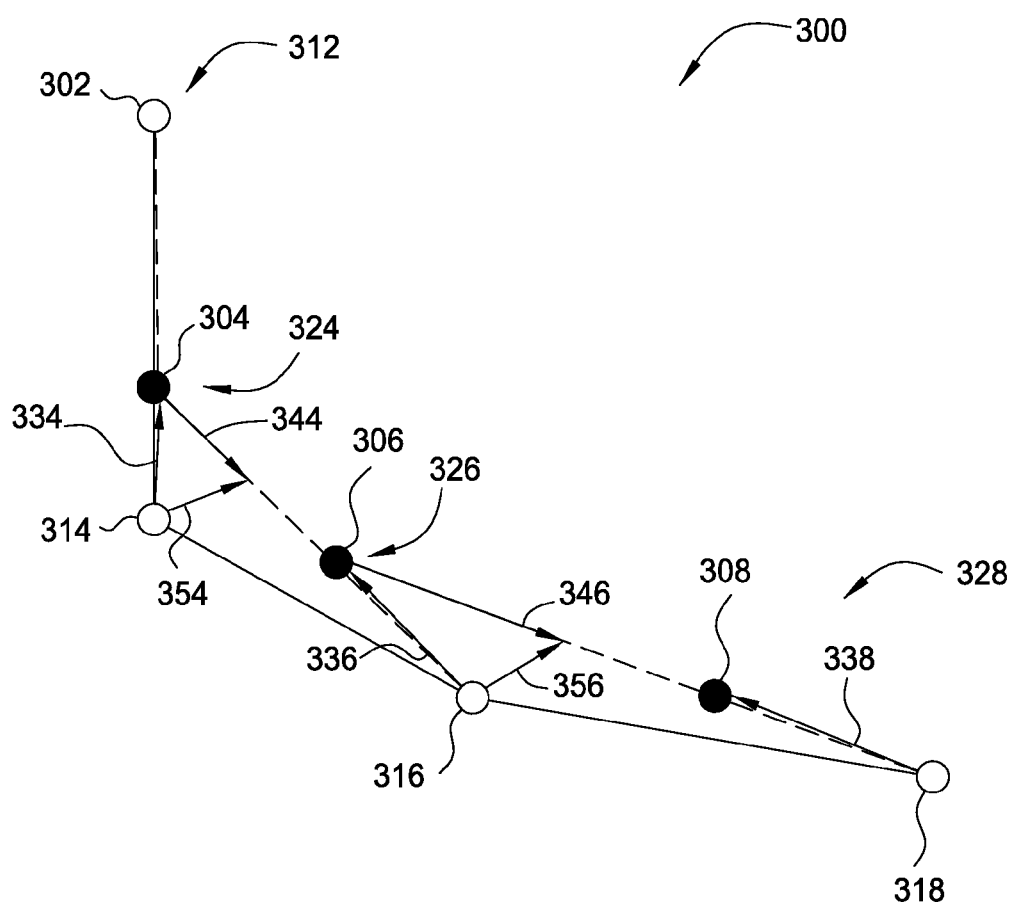

FIG. 3C is a conceptual diagram that represents the chain 300 of modeled particles, according to one embodiment of the present invention. As shown, chain 300 includes particles 302, 304, 306, and 308 residing at positions 312, 324, 326, and 328. Once simulation engine 150 has adjusted the position prediction of each particle to meet the set of physical constraints, as discussed above in conjunction with FIG. 3B, simulation engine 150 may then generate a velocity prediction for each particle based on two separate factors.

For a given particle, simulation engine 150 determines the first velocity prediction factor for that particle based on the distance between the position prediction for the particle (such as that generated by step 202 of the method 200), the adjusted position prediction for the particle (such as that generated at step 204 of the method 200), and the length of the time step implemented by simulation engine 150 for the physical simulation. The first velocity prediction factor represents the predicted velocity of the particle after traversing the distance between the position prediction and the adjusted position prediction during the time step.

For example, when simulation engine 150 adjusts position prediction 314 of particle 304, thereby moving particle 304 to position 324, simulation engine 150 could then compute the first velocity prediction factor for particle 304 as velocity 334. Likewise, when simulation engine 150 adjusts position prediction 316 of particle 306, thereby moving particle 306 to position 326, simulation engine 150 could then compute the first velocity prediction factor for particle 306 as velocity 336. Further, when simulation engine 150 adjusts position prediction 318 of particle 308, thereby moving particle 308 to position 328, simulation engine 150 could then compute the first velocity prediction factor for particle 308 as velocity 338.

For a given particle, simulation engine 150 may then compute the second velocity prediction factor for that particle based on the first velocity prediction factor associated with the subsequent particle in the chain of particles as well as a damping factor. For example, simulation engine 150 may compute the second velocity prediction factor for particle 304 as the inverse of velocity 336 (associated with particle 306) multiplied by the damping factor, shown in FIG. 3C as velocity 344. Likewise, simulation engine 150 may compute the second velocity prediction factor for particle 306 as the inverse of velocity 338 (associated with particle 308) multiplied by the damping factor, shown in FIG. 3C as velocity 346. In one embodiment, the damping factor is a decimal between 0 and 1. For a particle residing at the end of chain 300, such as particle 308, simulation engine 150 may not compute the second velocity prediction factor since that particle does not have a subsequent particle.

For a given particle, simulation engine 150 is configured to compute the velocity prediction for that particle based on the first and second velocity prediction factors described above. In one embodiment, simulation engine 150 adds the two velocity prediction factors together to generate the overall velocity prediction for a given particle. For example, simulation engine 150 could compute the velocity prediction 354 for particle 304 based on velocities 334 and 344. Likewise, simulation engine 150 could compute the velocity prediction 356 for particle 306 based on velocity 336 and 346. Step 206 of the method 200 discussed above in conjunction with FIG. 2 describes a general approach for computing the velocity prediction for a given particle.

Once simulation engine 150 has generated an adjusted position prediction and a velocity prediction for each particle in chain 300, simulation engine 150 may update the position and velocity of each particle in chain 300 to reflect those adjusted position predictions and velocity predictions, as described in greater detail below in conjunction with FIG. 3D.

Figure 3D:
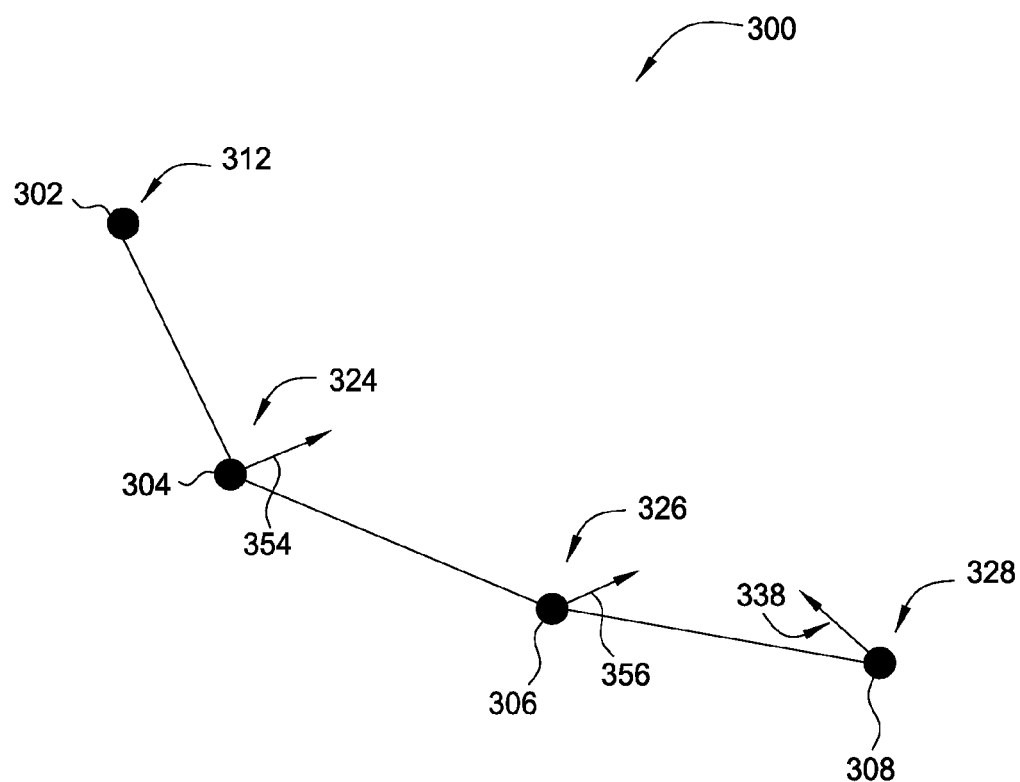

FIG. 3D is a conceptual diagram that represents the chain 300 of modeled particles, according to one embodiment of the present invention. As shown, particles 302, 304, 306, and 308 reside at positions 312, 324, 326, and 328, respectively. Particles 304, 306, and 308 have velocities 354, 356, and 338, respectively. Simulation engine 150 may update the positions and velocities of particles 302, 304, 306, and 308 in like fashion as described above in conjunction with steps 208 and 210 of the method 200 shown in FIG. 2. Once simulation engine 150 has updated the position of each particle in the physical simulation according to the techniques described above, simulation engine 150 may then generate a set of pixels that represent those particles. Simulation engine 150 may then output those pixels to a display device, e.g. for display to an end-user.

Those skilled in the art will understand that the example discussed in conjunction with FIGS. 3A-3D represents just one possible implementation of the techniques described herein, and that other implementations are also possible.

In sum, a simulation engine is configured to generate a physical simulation of a chain of particles by implementing a physics-based algorithm. The simulation engine is configured to generate a predicted position for each particle and to then adjust the predicted position of each particle based on a set of constraints associated with the physics-based algorithm. The simulation engine may then generate a predicted velocity for a given particle based on the adjusted, predicted position of that particle and based on the adjusted, predicted position of an adjacent particle.

Advantageously, the simulation engine is capable of updating the position of each particle within the physical simulation with just one iteration of the physics-based algorithm, thereby allowing that algorithm to be implemented in real-time simulations such as video games.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as compact disc read only memory (CD-ROM) disks readable by a CD-ROM drive, flash memory, read only memory (ROM) chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

What is claimed is:

1. A computer-implemented method for generating a physical simulation of a chain of particles, the method comprising:
   generating, via a processor executing one or more execution threads, a position prediction for a particle in the chain of particles based on a set of physical rules associated with the physical simulation;
   generating, via the processor, an adjusted position prediction for the particle based on the position prediction, a set of physical constraints associated with the chain of particles, and an anchor particle that resides at one end of the chain of particles;
   generating, via the processor, a velocity prediction for the particle based on a first predicted velocity associated with the particle and based on a second predicted velocity associated with a first subsequent neighbor particle residing adjacent to the particle in the chain of particles, wherein the particle is located between the anchor particle and the first subsequent neighbor particle in the chain of particles;
   updating, via the processor, a current position of the particle on a display device to reflect the adjusted position prediction associated with the particle; and
   updating, via the processor, a current velocity of the particle to reflect the velocity prediction associated with the particle.

2. The computer-implemented method of claim 1, wherein the set of physical rules associated with the physical simulation comprises Newton's laws of motion, and further comprising generating the position prediction associated with the particle based on the current position of the particle, the current velocity of the particle, a set of forces applied to the particle, and a time step associated with the physical simulation.

3. The computer-implemented method of claim 1, wherein the set of physical constraints comprises a distance constraint between the particle and a second neighbor particle residing adjacent to the particle, the distance constraint reflecting that the particle resides a first distance from the second neighbor particle, and further comprising generating the adjusted position prediction for the particle by adjusting the position prediction associated with the particle so that the adjusted position prediction of the particle and a position associated with the second neighbor particle are separated by the first distance.

4. The computer-implemented method of claim 1, wherein the first predicted velocity is derived from the position prediction associated with the particle, the adjusted position prediction associated with the particle, and a time step associated with the physical simulation, wherein the position prediction is generated at each time step in the physical simulation.

5. The computer-implemented method of claim 1, wherein the second predicted velocity is derived from a position prediction associated with the first subsequent neighbor particle, an adjusted position prediction associated with the first subsequent neighbor particle, and a time step associated with the physical simulation, wherein the position prediction is generated at each time step in the physical simulation.

6. The computer-implemented method of claim 1, further comprising generating a set of pixels based on the current position of the particle within the chain of particles, and outputting the set of pixels to the display device, wherein the set of pixels represents a strand of hair or fur.

7. The computer-implemented method of claim 1, wherein the physical simulation comprises a real-time physical simulation generated by a simulation engine that resides within a video game application.

8. The computer-implemented method of claim 1, wherein a parallel processing unit (PPU) that includes a plurality of processing cores is configured to execute the physical simulation on at least a first processing core and a second processing core included in the plurality of processing cores, and wherein each of the first processing core and the second processing core is configured to simulate the dynamics of a different chain of particles.

9. The computer-implemented method of claim 1, wherein the anchor particle attaches the chain of particles to another object within the physical simulation.

10. A non-transitory computer-readable medium storing program instructions that, when executed by a processor, cause the processor to generate a physical simulation of a chain of particles by performing the steps of:
generating a position prediction for a particle in the chain of particles based on a set of physical rules associated with the physical simulation;
generating an adjusted position prediction for the particle based on the position prediction, a set of physical constraints associated with the chain of particles, and an anchor particle that resides at one end of the chain of particles;
generating a velocity prediction for the particle based on a first predicted velocity associated with the particle and based on a second predicted velocity associated with a first subsequent neighbor particle residing adjacent to the particle in the chain of particles, wherein the particle is located between the anchor particle and the first subsequent neighbor particle in the chain of particles;
updating a current position of the particle on a display device to reflect the adjusted position prediction associated with the particle; and
updating a current velocity of the particle to reflect the velocity prediction associated with the particle.

11. The non-transitory computer-readable medium of claim 10, wherein the set of physical rules associated with the physical simulation comprises Newton's laws of motion, and further comprising generating the position prediction associated with the particle based on the current position of the particle, the current velocity of the particle, a set of forces applied to the particle, and a time step associated with the physical simulation.

12. The non-transitory computer-readable medium of claim 10, wherein the set of physical constraints comprises a distance constraint between the particle and a second neighbor particle residing adjacent to the particle, the distance constraint reflecting that the particle resides a first distance from the second neighbor particle, and further comprising generating the adjusted position prediction for the particle by adjusting the position prediction associated with the particle so that the adjusted position prediction of the particle and a position associated with the second neighbor particle are separated by the first distance.

13. The non-transitory computer-readable medium of claim 10, wherein the first predicted velocity is derived from the position prediction associated with the particle, the adjusted position prediction associated with the particle, and a time step associated with the physical simulation, wherein the position prediction is generated at each time step in the physical simulation.

14. The non-transitory computer-readable medium of claim 10, wherein the second predicted velocity is derived from a position prediction associated with the first subsequent neighbor particle, an adjusted position prediction associated with the first subsequent neighbor particle, and a time step associated with the physical simulation, wherein the position prediction is generated at each time step in the physical simulation.

15. The non-transitory computer-readable medium of claim 10, further comprising generating a set of pixels based on the current position of the particle within the chain of particles, and outputting the set of pixels to the display device, wherein the set of pixels represents a strand of hair or fur.

16. The non-transitory computer-readable medium of claim 10, wherein the physical simulation comprises a real-time physical simulation generated by a simulation engine that resides within a video game application.

17. The non-transitory computer-readable medium of claim 10, wherein a parallel processing unit (PPU) that includes a plurality of processing cores is configured to execute the physical simulation on at least a first processing core and a second processing core included in the plurality of processing cores, and wherein each of the first processing core and the second processing core is configured to simulate the dynamics of a different chain of particles.

18. The non-transitory computer-readable medium of claim 10, wherein the anchor particle is connected to only one particle included in the chain of particles, and a final particle that resides at a second end of the chain of particles also is connected to only one other particle included in the chain of particles.

19. A computing device configured to generate a physical simulation of a chain of particles, including:
a memory storing instructions; and
a processor coupled to the memory and, when executing the instructions, is configured to:
generate a position prediction for a particle in the chain of particles based on a set of physical rules associated with the physical simulation;
generate an adjusted position prediction for the particle based on the position prediction, a set of physical constraints associated with the chain of particles, and an anchor particle that resides at one end of the chain of particles;
generate a velocity prediction for the particle based on a first predicted velocity associated with the particle, a second predicted velocity associated with a first subsequent neighbor particle residing adjacent to the particle in the chain of particles, wherein the particle is located between the anchor particle and the first subsequent neighbor particle in the chain of particles;
update a current position of the particle on a display device to reflect the adjusted position prediction associated with the particle; and
update a current velocity of the particle to reflect the velocity prediction associated with the particle.

20. The computing device of claim 19, further including:
a memory unit coupled to the processor and storing program instructions that, when executed by the processor, cause the processor to:

generate the position prediction for the particle in the chain of particles;

generate the adjusted position prediction for the particle;

generate the velocity prediction for the particle;

update the current position of the particle on the display device; and update the current velocity of the particle.

21. The computing device of claim 19, wherein the set of physical rules associated with the physical simulation comprises Newton's laws of motion, and further comprising generating the position prediction associated with the particle based on the current position of the particle, the current velocity of the particle, a set of forces applied to the particle, and a time step associated with the physical simulation, and wherein the set of physical constraints comprises a distance constraint between the particle and a second neighbor particle residing adjacent to the particle, the distance constraint reflecting that the particle resides a first distance from the second neighbor particle, and further comprising generating the adjusted position prediction for the particle by adjusting the position prediction associated with the particle so that the adjusted position prediction of the particle and a position associated with the second neighbor particle are separated by the first distance.

22. The computing device of claim 19, wherein the first predicted velocity is derived from the position prediction associated with the particle, the adjusted position prediction associated with the particle, and a time step associated with the physical simulation, and wherein the second predicted velocity is derived from a position prediction associated with the first subsequent neighbor particle, an adjusted position prediction associated with the first subsequent neighbor particle, and the time step associated with the physical simulation, wherein the position prediction is generated at each time step in the physical simulation.

* * * * *

UNITED STATES PATENT AND TRADEMARK OFFICE
CERTIFICATE OF CORRECTION

PATENT NO.       : 9,785,729 B2
APPLICATION NO.  : 13/714859
DATED            : October 10, 2017
INVENTOR(S)      : Matthias Muller-Fischer, Nuttapong Chentanez and Tae-Yong Kim It is certified that error appears in the above-identified patent and that said Letters Patent is hereby corrected as shown below:

On the Title Page

(56) References Cited:
Page 2, Please delete "Mailer et al., Position based dynamics, Apr. 2007, Journal of Visual Communication and Image Representation, vol. 18, Issue 2, ISSN 1047-3203, pp. 109-118.*" and insert --Müller et al., Position based dynamics, Apr. 2007, Journal of Visual Communication and Image Representation, vol. 18, Issue 2, ISSN 1047-3203, pp. 109-118.*--.

Signed and Sealed this
Twenty-second Day of May, 2018

Andrei Iancu
*Director of the United States Patent and Trademark Office*